United States Patent [19]
Hoinkis et al.

[11] Patent Number: 5,872,694
[45] Date of Patent: Feb. 16, 1999

[54] METHOD AND APPARATUS FOR DETERMINING WAFER WARPAGE FOR OPTIMIZED ELECTROSTATIC CHUCK CLAMPING VOLTAGE

[75] Inventors: Mark Hoinkis, Fishkill; Darryl Restaino, Modena, both of N.Y.

[73] Assignees: Siemens Aktiengesellschaft, Munich, Germany; International Business Machines Corporation, Armonk, N.Y.

[21] Appl. No.: 996,576

[22] Filed: Dec. 23, 1997

[51] Int. Cl.[6] .................................................. H02N 13/00
[52] U.S. Cl. ............................................. 361/234; 361/235
[58] Field of Search .................................. 361/230, 233, 361/234, 235; 279/128

[56] References Cited

U.S. PATENT DOCUMENTS

| | | |
|---|---|---|
| 5,103,367 | 4/1992 | Horwitz et al. . |
| 5,202,748 | 4/1993 | MacDonald et al. .................... 356/360 |
| 5,325,261 | 6/1994 | Horwitz . |
| 5,436,790 | 7/1995 | Blake et al. . |
| 5,515,167 | 5/1996 | Ledger et al. ........................... 356/360 |
| 5,535,090 | 7/1996 | Sherman ................................. 361/234 |
| 5,642,298 | 6/1997 | Mallory et al. . |

OTHER PUBLICATIONS

GPI Web Client abs of JP403108736A, Method and Apparatus for inspecting Wafer, Mori, May 1991.
GPI Web Client abs of JP357032629A, Mask Aligner, Katsuyama, Feb. 1982.
GPI Web Client abs of JP361019130A, Vacuum Chuck, Kitakata, Jan. 1986.
GPI Web Client abs of JP359208741A, Attracting Chuck Device for Seminconductor Wafer, Nishioka, Nov. 1984.

*Primary Examiner*—Fritz Fleming
*Attorney, Agent, or Firm*—Stanton C. Braden

[57] ABSTRACT

Method and apparatus are provided for determining a warpage of a wafer (14) for providing a minimum clamping voltage to an electrostatic chuck (ESC) when the wafer is subsequently processed thereon. The apparatus includes an electrostatic chuck (12, 120) and a control arrangement (16, 18, 20). The electrostatic chuck includes a clamping surface (13, 130) for clamping a wafer thereto by a clamping force that is dependent on a clamping voltage applied to the electrostatic chuck. The control arrangement is used to detect an inherent warpage in the wafer prior to a processing of that wafer, and determine a minimum clamping voltage from the measured warpage that is to be applied to the electrostatic chuck during a subsequent processing of the wafer. The minimum clamping voltage has a value for each wafer that securely clamps the wafer to the clamping surface and avoids excessive warpage and backside abrasion of the wafer. The control arrangement includes a suitable wafer warpage measuring tool (20, 50, 52, 54) such as, for example, a capacitance warpage measuring tool (50, 52, 54) or a optical warpage measuring tool (20) that measures the inherent warpage of a wafer, and an electrostatic chuck software control (18). The electrostatic chuck software control uses the measured warpages to determine and store data of a minimum clamping voltages and an associated wafer identification for each wafer for use in subsequently processing each wafer.

24 Claims, 3 Drawing Sheets

METHOD AND APPARATUS FOR DETERMINING WAFER WARPAGE FOR OPTIMIZED ELECTROSTATIC CHUCK CLAMPING VOLTAGE

FIELD OF THE INVENTION

The present invention relates to method and apparatus for determining an inherent warpage in a wafer in order to determine and provide an optimum clamping voltage for that wafer in an electrostatic chuck during a processing of that wafer.

BACKGROUND OF THE INVENTION

Electrostatic chucks (ESC) are presently being developed and used for the fabrication of semiconductor wafers. The concept of an ESC is to replace mechanical wafer clamping mechanisms with an electrostatic clamping mechanism in order to realize advantages such as reduced particles, better temperature control, and reduced edge exclusion zones.

One of the properties of ESCs (monopolar and bipolar) is that the clamping force increases as the voltage applied to the ESC increases. A clamping force which holds the wafer on a temperature controlled pedestal of the electrostatic chuck is needed to enhance thermal conductance (usually aided by a backside gas pressure on the wafer) between the wafer and the pedestal. This provides better wafer temperature control and uniformity.

U.S. Pat. Ser. No. 5,103,367 (Horwitz et al.), issued on Apr. 7, 1992, discloses an electrostatic chuck (ESC) for semiconductor wafers using A.C. field excitation. The chuck comprises first and second aligned electrodes embedded in a thin dielectric film that define a substantially planar surface. The first and second electrodes are each excited by a low-frequency AC supply to produce sine wave field of controlled amplitude and phase that provides a low resultant voltage on the wafer surface. A third electrode disposed parallel to the first and second electrodes acts as a shield electrode or a reference point for the first and second electrodes. By controlled rates of voltage application and removal, low voltage gradients are obtained on the wafer and no retentive forces exist in the dielectric medium. In one embodiment, a low AC amplitude excitation of the chuck enables capacitive current sensing of the position of the wafer relative to the dielectric film, thereby enabling simple control of the voltage application to the first and second electrodes.

U.S. Pat. No. 5,325,261 (Horwitz), issued on Jun. 28, 1994, discloses an electrostatic chuck (ESC) system for holding a body (such as a semiconductor wafer) with improved release thereof. The ESC system comprises a holding device such as an electrostatic chuck having a surface for contacting the body, an electrode and applying means for applying a drive voltage to the electrode in order to electrostatically grip the body to the surface, and determining means for determining a value of a drive release voltage to be applied to the electrode in order to enable a release of the body. The determining means preferably comprises monitoring means for monitoring the motion of the body as the drive voltage is varied. The applying means is capable of applying a voltage signal over the drive voltage in order to cause oscillating motion of the body. This oscillating motion of the body is monitored by position sensing circuitry to produce a demodulated sense output in accordance with the oscillation. As the drive voltage is varied, a point will be reached where the body is released. This point can be determined by monitoring the demodulated AC sense output.

Although a minimum amount of threshold voltage is usually required to clamp a wafer to a pedestal of an electrostatic chuck, a voltage which is excessively high will "press" the wafer onto the pedestal and cause abrasion between the wafer and the pedestal surfaces. This is undesirable and can lead to particle problems and/or a shortened chuck life. Thus a trade-off exists between applying too much voltage to the chuck, which can shorten the ESC life and cause particle problems, and not applying enough voltage such that the wafer is not sufficiently clamped to the pedestal of the electrostatic chuck.

It was found that wafers with a large inherent bow or warpage (usually a result of film stress) need a higher ESC chucking or clamping voltage in order to provide a sufficient clamping force. In other words, an optimum ESC clamping voltage depends on the extent of wafer warpage or bow, and, therefore, the higher the inherent wafer warpage the greater the ESC clamping voltage that is needed. Presently, a single ESC clamping voltage is used for one or more groups of wafers which is much higher than is required. Factors such as a heater set point of the electrostatic chuck and estimates of inherent wafer warpage are often taken into consideration to determine the value of the ESC clamping voltage for the one or more groups of wafers. There are still instances in which wafers do not properly clamp due to an excessive amount of inherent wafer bowing or warpage. There are also wafers which can be clamped with a lower voltage than the single ESC clamping voltage used for a group of wafers such that backside abrasion and scratching can be reduced or avoided.

Since the inherent warpage varies from wafer to wafer, it is desired to provide a method and apparatus that will measure the inherent bow or warpage in a wafer, and use such measured data to apply a substantially optimum chucking or clamping voltage for each wafer to an electrostatic chuck in order to substantially avoid excessive amounts of backside abrasion and scratching of the wafer while the wafer is being processed.

SUMMARY OF THE INVENTION

The present invention is directed to method and apparatus for determining wafer warpage in an electrostatic chuck in order to provide an optimum clamping voltage used by the electrostatic chuck during the processing of each wafer.

Viewed from one aspect, the present invention is directed to apparatus for processing semiconductor wafers and similar devices comprising an electrostatic chuck and a control arrangement. The electrostatic chuck comprises a clamping surface for clamping a wafer thereto by a clamping force on the wafer that is dependent on a clamping voltage applied to the electrostatic chuck. The control arrangement detects an inherent warpage in the wafer, and using the detected inherent wafer warpage, determines a minimum clamping voltage to be applied to the electrostatic chuck during a processing of the wafer mounted on the clamping surface. The value of the minimum clamping voltage is such that it avoids excessive warpage and backside abrasion of the wafer while securely clamping the wafer to the clamping surface.

Viewed from another aspect, the present invention is directed to a method of processing semiconductor wafers and similar devices comprising the following steps. In a first step, a wafer is mounted on a predetermined surface. In a second, a warpage of the wafer is measured prior to the wafer being processed. In a third step, a minimum clamping voltage to be used for the wafer is determined from the wafer warpage measured in the second step. In a fourth step, the wafer is mounted on a clamping surface of an electrostatic chuck and the minimum clamping voltage determined in the third step is applied to the electrostatic chuck.

The invention will be better understood from the following more detailed description taken with the accompanying drawings and claims.

The drawings are not necessarily to scale.

DETAILED DESCRIPTION

It is to be understood that corresponding elements having the same function in the several views of the drawings are provided with the same designation numbers.

Figure 1:
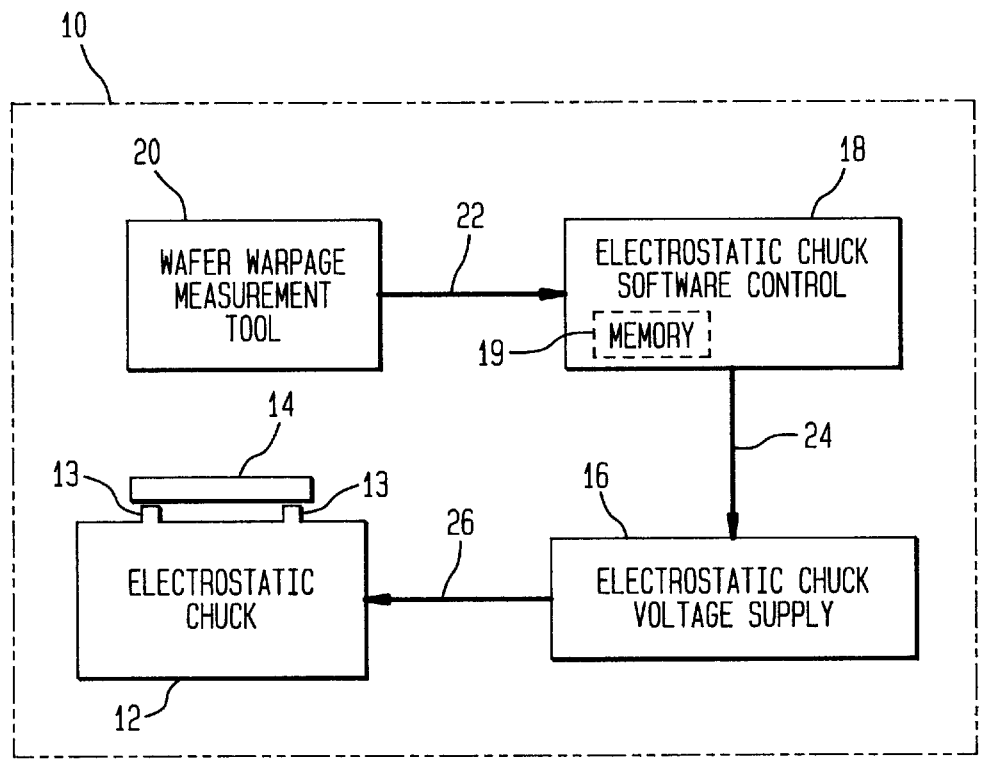
FIG. 1 is a block diagram of an electrostatic chuck system in accordance with the present invention.

Referring now to FIG. 1, there is shown a block diagram of an electrostatic chuck system 10 (shown within a dashed line rectangle) in accordance with the present invention. The electrostatic chuck system 10 comprises an electrostatic chuck 12 including a pedestal 13 which is configured so as to facilitate the mounting and clamping of a wafer 14 thereon, an electrostatic chuck voltage supply 16, an electrostatic chuck software control 18 including a memory 19, and a wafer warpage measurement tool 20. It is to be understood that the electrostatic chuck voltage supply 16 and the electrostatic chuck software control 18 can be part of, or mounted separate from, the electrostatic chuck 12, and are each well known in the art. Still further, it is to be understood that the wafer warpage measurement tool 20 can be part of, or separate from, the system 10 as will be shown hereinafter.

The wafer warpage measurement tool 20 is coupled to the electrostatic chuck software control 18 via one or more leads 22; the electrostatic chuck software control 18 is coupled to the electrostatic chuck voltage supply 16 via one or more leads 24; and the electrostatic chuck voltage supply 16 is coupled to the electrostatic chuck 12 via one or more leads 26. It is to be understood that the wafer warpage measurement tool 20 is used to measure an inherent bowing or warping in the wafer 14, and for supplying such inherent wafer bowing or warping data to the electrostatic chuck software control 18 via leads 22. Still further, the measurement of wafer warpage is typically performed prior to a processing of the wafer 14 on the electrostatic chuck. This inherent bowing or warping data obtained for a wafer 14 is used by the electrostatic chuck software control 18 for determining and storing a value of a minimum clamping voltage in the memory 19 for that wafer 14. This value of the minimum clamping voltage stored in the memory 19 is the clamping voltage value to be applied by the electrostatic chuck voltage supply 16 to the electrostatic chuck 12 during a subsequent processing of that wafer 14. Such minimum clamping voltage is used to sufficiently clamp the wafer 14 to the pedestal 13 of the electrostatic chuck 12 so as to allow high thermal conduction between the wafer 14 and the electrostatic chuck 12. This avoids excessive amounts of backside abrasion and scratching of the wafer 14. The wafer warpage measurement tool 20 can comprise any suitable arrangement that will measure the inherent bow or warp in a wafer. Exemplary arrangements of the wafer warpage measurement tool 20 will be discussed hereinafter in relation to FIGS. 3 and 4.

Figure 2:
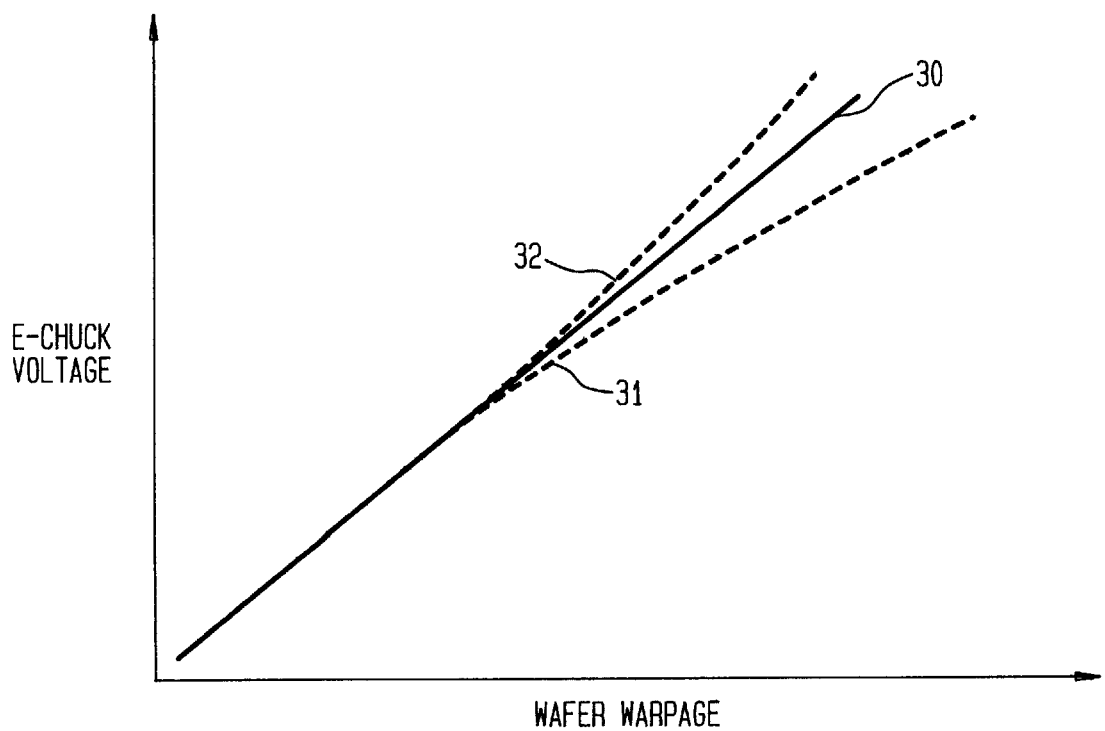
FIG. 2 shows exemplary graphs of electrostatic chuck (E-CHUCK) voltage versus wafer warpage for a predetermined electrostatic chuck temperature and a wafer being processed.
Figure 3:
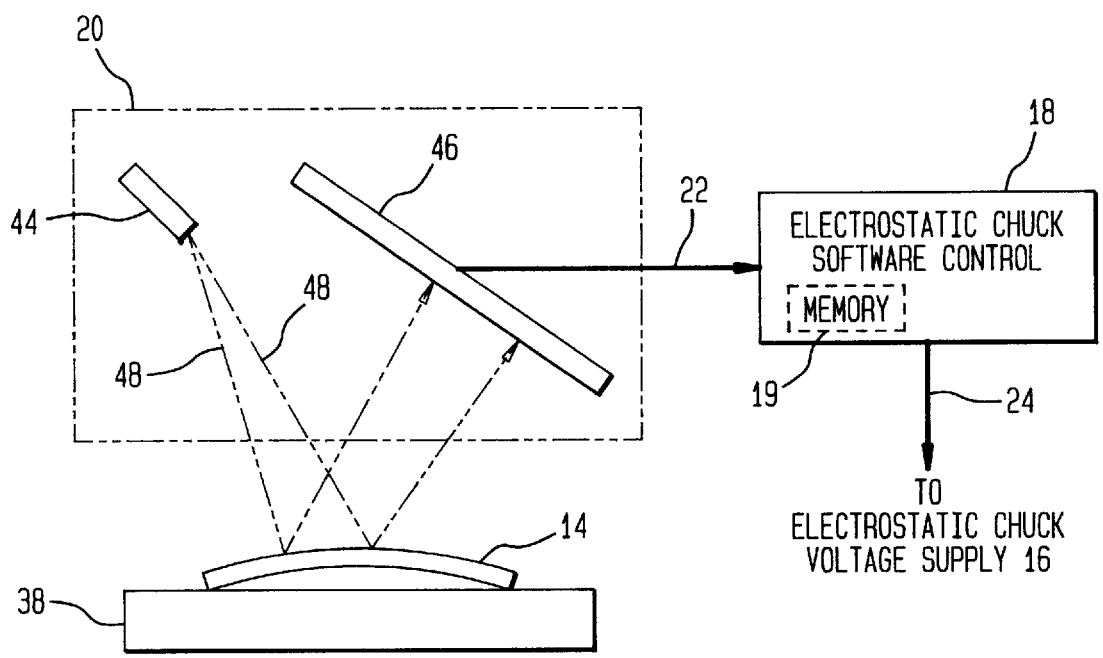
FIG. 3 is a diagram of the an exemplary optical arrangement for measuring the inherent warpage in a wafer for using such data in the electrostatic chuck system of FIG. 1 in accordance with the present invention.
Figure 4:
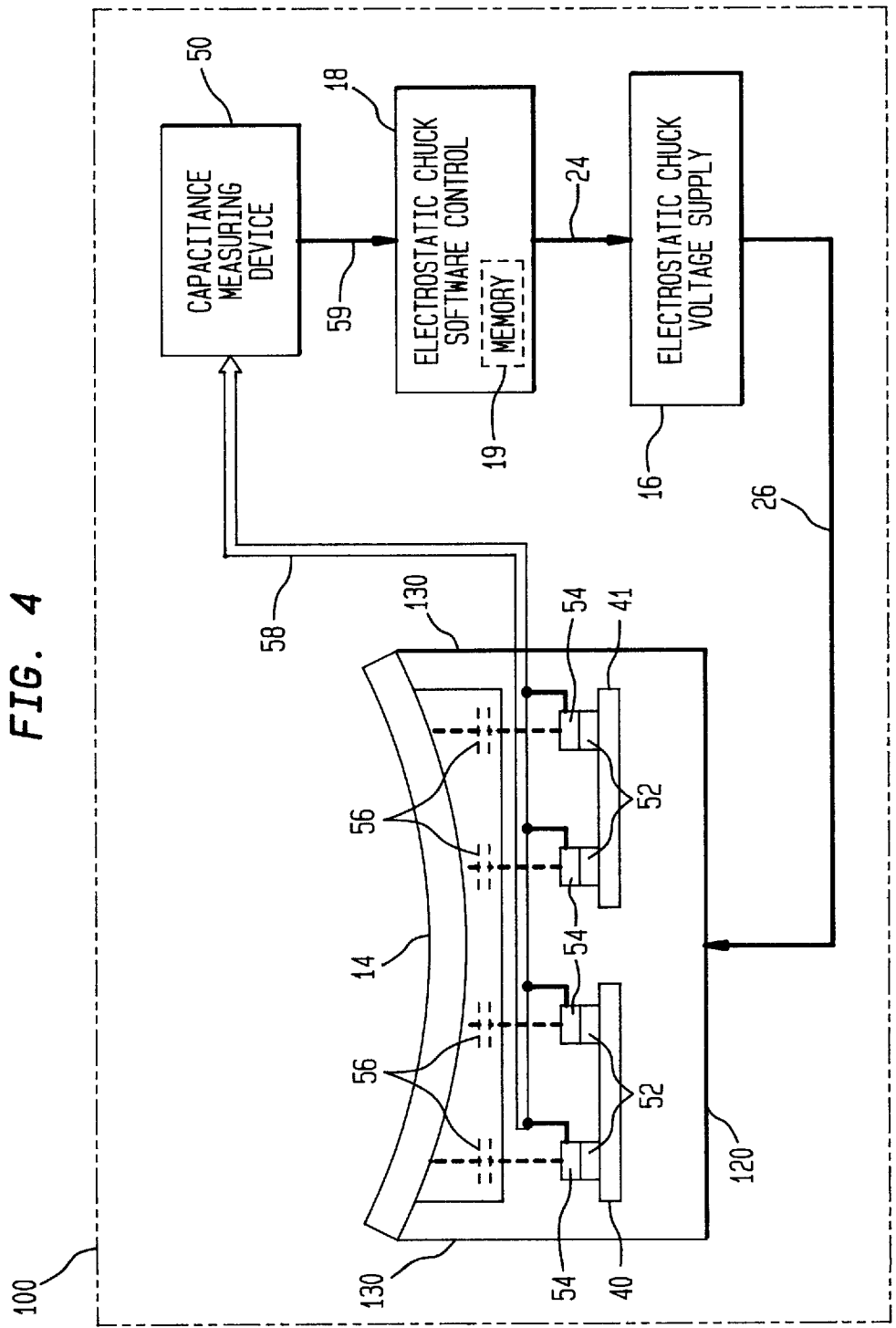
FIG. 4 is a diagram of the electrostatic chuck system of FIG. 1 using an exemplary capacitive arrangement for measuring the inherent warpage in a wafer and using such data in the electrostatic chuck system of FIG. 1 in accordance with the present invention.

Referring now to FIG. 2, there is shown an exemplary graph of electrostatic chuck (E-CHUCK) voltage versus wafer warpage. Before a routine (production) processing of wafers (such as wafer 14) is performed, standard curves are established such as the exemplary curves 30, 31, or 32 shown in FIG. 2. Differences between the standard curves such as 30 (linear plot), 31 (downward curving plot shown as a dashed line), or 32 (upward curving plot shown as a dashed line) are dependent on specific parameters such as E-chuck temperature. Curves, such as curves 30, 31, or 32, are empirically established prior to the routine processing of various wafers. These curves are stored in the memory 19 and are accessible by the electrostatic chuck software control 18. The curves constitute the relationship from which the E-chuck voltage setpoint is chosen once wafer warpage—for a specific test wafer which is going to be routinely processed—is established. One technique for obtaining curves, such as curves 30, 31, or 32, is as follows. A wafer whose warpage is premeasured, (and therefore known) by using any suitable technique such as that described hereinafter for either one of FIGS. 3 and 4, is placed on the electrostatic chuck 12 and a high clamping voltage is applied from the electrostatic chuck voltage supply 16. A gas under a predetermined pressure is then applied (by means not shown in FIG. 1) in the area bounded by a backside surface of the wafer being tested, and inner surface of the pedestal 13, and a top surface of the electrostatic chuck 12. Such pressurized gas is used to determine if the test wafer is suitably clamped to the electrostatic chuck 12. When the test wafer is sufficiently clamped to the electrostatic chuck 12, the backside pressure remains substantially steady. The clamping voltage applied to the electrostatic chuck 12 is then slowly decreased until the gas pressure abruptly changes to zero. This abrupt change indicates a threshold voltage in which the electrostatic chuck clamping force has been exceeded by the backside gas pressure for the test wafer. Any value of the clamping voltage above such threshold voltage can be used for a minimum clamping voltage to be stored in the memory 19. This procedure establishes a single point on a single curve 30, 31, or 32 of FIG. 2 for the minimum clamping voltage for the test wafer. To empirically determine other points to establish the standard curves 30, 31, or 32, this procedure is repeated with other test wafers of different warpages, and for different processing conditions.

Returning now to FIG. 1, for the routine (production) processing of any wafer 14 once the minimum clamping voltages and the standard curves 30, 31, or 32 have been determined as described hereinbefore, the following sequence is prescribed. The wafer 14 is measured for wafer warpage by any suitable arrangement as, for example, described hereinafter for FIGS. 3 and 4. From the curves obtained in FIG. 2, the electrostatic chuck software control 18 transforms wafer warpage values to a value for the clamping voltage for a specific wafer 14 (based on warpage), and stores in the memory 19 an associated identification (e.g., a number, a bar code, etc.) of that wafer 14 and the minimum electrostatic chuck clamping voltage to be applied when that wafer 14 is routinely processed. When the wafer 14 is placed on the pedestal 13 of the electrostatic chuck 12, which has been heated to a steady predetermined temperature, the electrostatic chuck software control 18 identifies the wafer 14 being routinely processed and retrieves the predetermined minimum clamping voltage for that wafer 14 from the memory 19. The electrostatic chuck software control 18 transmits control signals via the one or more leads 24 to the electrostatic chuck voltage supply 16 to cause the minimum clamping voltage retrieved from the memory 19 to be applied to the electrostatic chuck 12 during processing of the wafer 14.

Referring now to FIG. 3, there is shown a diagram of an exemplary optical wafer warpage measurement tool 20 for measuring the inherent warpage or bowing of a wafer 14 in accordance with the present invention. The optical wafer warpage measurement tool 20 comprises a laser 44 for generating a narrow laser beam 48 (of which two beams are shown at different angles), and a photodetector array 46. In operation, a wafer 14 to be measured is placed on a flat object 38, such as a stand or a pedestal, so that the laser 44 is able to scan the narrow laser beam 48 across the exposed surface of the wafer 14. The laser 44 is energized and is caused to scan the narrow laser beam 48 across the exposed surface of the wafer 14 in a predetermined pattern. The light in the laser beam 48 is reflected from each point where the beam 48 impinges on the exposed surface of the wafer 14 to a separate point on the photodetector array 46. The point at which the laser beam 48 impinges the photodetector array 46 is dependent on the amount of warpage in the wafer 14 at the point the laser beam 48 impinges the wafer 14. In other words, the light reflected from one or more predetermined points on the exposed surface of the wafer 14 will be reflected to different points on the photodetector array 46 dependent on the amount of inherent warpage in the wafer 14. This information is transmitted from the photodetector array 46 to the electrostatic chuck software control 18 via leads 22. The electrostatic chuck software control 18 correlates the information from photodetector array 46 into wafer warpage values, and determines from such values a minimum clamping voltage that should be applied to the electrostatic chuck 12 (shown in FIG. 1) during subsequent processing of that wafer 14. This minimum clamping voltage determined by the electrostatic chuck software control 18, along with an identification of the wafer 14 being empirically tested is stored in the memory 19 of the electrostatic chuck software control 18 in a look-up table (not shown). During subsequent processing of this wafer 14, the electrostatic chuck software control 18 identifies the wafer 14 being processed and obtains the minimum clamping voltage previously stored in the memory 19 for that wafer 14. The electrostatic chuck software control 18 sends a corresponding control signal to the electrostatic voltage supply 16 to cause the clamping voltage of the electrostatic chuck to be set to the indicated minimum clamping voltage when that wafer is being processed. It is to be understood that the optical wafer warpage measurement tool 20 of FIG. 3 is an exemplary arrangement that can be used for the wafer warpage measurement tool 20 of FIG. 1.

Referring now to FIG. 4, there is shown a diagram of the electrostatic chuck system 100 which is very similar to system 10 of FIG. 1 and provides a specific embodiment of an exemplary capacitive arrangement for the wafer warpage measuring tool 20 of FIG. 1 for determining wafer warpage in accordance with the present invention. The elements of the system 100 which are identical to the elements of the system 10 are provided with the same designation number. The system 100 comprises an electrostatic chuck 120, an electrostatic chuck voltage supply 16, and an electrostatic chuck software control 18 including a memory 19. The electrostatic chuck 120 is a modified version of the chuck 12 of system 10 and comprises a pedestal 130 on which a wafer 14 is placed, a first electrode 40 and a second electrode 41 for providing a clamping force on the wafer 14 when a clamping voltage is applied from the electrostatic chuck voltage supply 16. The arrangement of the electrodes 40 and 41 of the electrostatic chuck 120 is well known to form a single bipolar electrostatic chuck 120 and is shown in, for example, U.S. Pat. No. 5,325,261 (Horwitz), issued on Jun. 28, 1994, which is herein incorporated by reference for all purposes. The electrostatic chuck 120, the electrostatic chuck voltage supply 16, and the electrostatic chuck software control 18 and memory 19 function in the same manner as was described for the elements 12, 16, 18, and 19, respectively, of FIG. 1.

The system 100 also includes a capacitive wafer warpage measuring arrangement forming the wafer warpage measuring tool 20 of FIG. 1 comprising the capacitance measuring device 50, and a plurality of metallic layers 54 which are mounted at predetermined points on an upper surface of the first and second electrodes 40 and 41 of the electrostatic chuck 120 by separate insulators 52. The metallic layers 54 are electrically connected to the capacitance measuring device 50 via separate leads of a cable or bus 58, and the capacitance measuring device 50 is coupled to the electrostatic chuck software control 18 by a leads 59.

In operation, a wafer 14 is positioned on the pedestal 130, and a capacitance 56 at all points between the backside surface of the wafer 14 and a metallic layer 54 therebelow on the first or second electrode 40 or 41 is produced. All of the capacitances 56 associated with the metallic layers 54 are measured by the capacitance measuring device 50. The capacitance measuring device 50 converts the capacitance measurements into corresponding electrical control signals which are transmitted via leads 59 to the electrostatic chuck software control 18. The electrostatic chuck software control 18 receives the capacitance measurements from the capacitance measuring device 50, and converts the capacitance measurements into corresponding wafer warpage values. The electrostatic chuck software control 18 uses the measured wafer warpage values to obtain a minimum clamping voltage to be used for that wafer 14, and stores such minimum clamping voltage in the memory 19 along with an identification of that wafer 14. During a subsequent processing of that wafer 14, the electrostatic chuck software control 18 uses the identification of the wafer 14 to obtain the minimum clamping voltage to be used with that wafer 14 from the memory 19. The electrostatic chuck software control 18 sends a corresponding control signal to the electrostatic voltage supply 16 to cause the electrostatic voltage supply 16 to apply the minimum clamping voltage to the electrodes 40 and 41 of the electrostatic chuck during the processing of the wafer 14.

In accordance with the present invention, the inherent warpage in each wafer 14 to be subsequently processed on an electrostatic chuck 12 or 120 is measured, and a minimum clamping voltage is determined from the measured warpage for subsequent use when that wafer 14 is processed. The minimum clamping voltage for each wafer is stored in a memory 19 of the electrostatic chuck software control 18 along with a predetermined identification for the wafer 14.

When the wafer 14 is subsequently processed on the electrostatic chuck 12 or 120, the identification of the wafer 14 is used by the electrostatic chuck software control 18 to access the memory 19 and read out the minimum clamping voltage stored for that wafer 14. This clamping voltage is then applied to the electrostatic chuck 12 or 120 during the processing of the wafer 14.

It is to be appreciated and understood that the specific embodiments of the invention described hereinabove are merely illustrative of the general principles of the invention. Various modifications may be made by those skilled in the art which are consistent with the principles set forth. For example, any other suitable optical or other warpage measuring arrangement known in the art from optical and capacitive method described hereinabove can be used for the wafer warpage measurement tool 20 of FIG. 1. It is to be understood, that the electrostatic chuck software control 18 and the electrostatic chuck voltage supply 16 can automatically set the clamping voltage on the electrostatic chuck to a minimal value for suitably clamping a wafer to the electrostatic chuck. However, in practice it is advisable to set the clamping voltage slight above the indicated minimal clamping voltage value in order to ensure suitable clamping of the wafer 14 to the electrostatic chuck 12 OR 120 in case certain parameters of heat and gas pressure vary slightly during the wafer processing. Such slightly increased minimum clamping voltage for a particular wafer 14 can be stored in the memory 19 in place of the empirically measured minimum clamping voltage.

What is claimed is:

1. Apparatus for processing semiconductor wafers and similar devices comprising:
   a single bipolar electrostatic chuck comprising a clamping surface for clamping a wafer thereto by a clamping force on the wafer that is dependent on a clamping voltage applied to the electrostatic chuck when the wafer is processed; and
   a control arrangement for measuring inherent warpage in the wafer prior to the wafer being processed on the electrostatic chuck, and using the measured inherent wafer warpage for determining a minimum clamping voltage to be applied to the electrostatic chuck during processing of the wafer mounted on the clamping surface of the electrostatic chuck that limits warpage and backside abrasion of the wafer while securely clamping the wafer to the clamping surface.

2. The apparatus of claim 1 wherein the control arrangement comprises:
   a warpage measuring arrangement for measuring an amount of inherent warpage across a surface of the wafer, and generating an output control signal representative of the amount of measured wafer warpage; and
   a controller responsive to the output control signal from the measuring arrangement for obtaining a predetermined minimum clamping voltage for the wafer which is dependent on the measured inherent wafer warpage, and for applying the obtained minimum clamping voltage to the electrostatic chuck during a subsequent processing of the wafer.

3. The apparatus of claim 2 wherein the measuring arrangement comprises a capacitive wafer warpage measuring tool for measuring a capacitance at predetermined points across a surface of the wafer, where a change in the capacitance between the predetermined points is in accordance with a change in warpage in the wafer.

4. The apparatus of claim 3 wherein:
   the electrostatic chuck comprises at least one electrode coupled to the control arrangement for producing the clamping force on the wafer mounted on the clamping surface; and
   the capacitive wafer warpage measuring tool comprises:
      a plurality of insulated spaced-apart metallic layers mounted on the at least one electrode, each layer providing a separate capacitance with the adjacent surface of the wafer; and
      a capacitance measuring device for measuring the capacitance at each of the plurality of metallic layers and providing a separate corresponding control signal to the controller for determining the minimum clamping voltage to be provided to the electrostatic chuck during a subsequent processing of the wafer.

5. The apparatus of claim 2 wherein the warpage measuring arrangement comprises an optical wafer warpage measuring arrangement for measuring the inherent warpage in the wafer.

6. The apparatus of claim 5 wherein the optical warpage measuring arrangement comprises:
   a laser for scanning a narrow laser beam across an exposed surface of the wafer; and
   a photodetector array disposed to intercept the laser beam reflected from the exposed surface of the wafer and provide a control signal to the controller indicating an amount of warpage of the wafer.

7. The apparatus of claim 1 wherein the control arrangement comprises:
   a warpage measuring arrangement for measuring an amount of inherent warpage across the wafer, and generating an output control signal representing the measured wafer warpage; and
   a software control comprising:
      a memory for storing data related to a minimum clamping voltage for each wafer and a separate identification for each wafer to be subsequently processed on the electrostatic chuck; and
      a controller responsive to the output control signal from the warpage measuring arrangement for determining and storing in the memory the minimum clamping voltage to be used for each identified wafer based on the measured wafer warpage, and for reading from the memory the minimum clamping voltage to be applied to the electrostatic chuck for a wafer being processed.

8. Apparatus for processing semiconductor wafers and similar devices comprising:
   a single bipolar electrostatic chuck comprising a clamping surface for mounting the wafer thereon;
   a clamping voltage generating device responsive to a control signal for generating a selective clamping voltage to the electrostatic chuck to provide a corresponding clamping force on a wafer mounted on the clamping surface; and
   a control arrangement for measuring inherent warpage in the wafer prior to the wafer being processed on the electrostatic chuck and determining from the measured inherent warpage a minimum clamping voltage for the wafer, and for generating an output control signal indicating a determined minimum clamping voltage for that wafer for transmission to the clamping voltage generating device for generating the minimum clamping voltage to the electrostatic chuck during processing of the wafer, where the minimum clamping voltage has a value that limits warpage and backside abrasion of the wafer while securely clamping the wafer on the clamping surface.

9. The apparatus of claim 8 wherein the control arrangement comprises:
a warpage measuring arrangement for measuring an amount of inherent warpage across a surface of the wafer, and generating an output control signal representative of the amount of measured wafer warpage; and
a controller responsive to the output control signal from the warpage measuring arrangement for obtaining a predetermined minimum clamping voltage for the wafer which is dependent on the measured inherent wafer warpage, and for applying the obtained minimum clamping voltage to the electrostatic chuck during a subsequent processing of the wafer.

10. The apparatus of claim 9 wherein the warpage measuring arrangement comprises a capacitive wafer warpage measuring tool for measuring a capacitance at predetermined points across a surface of the wafer, where a change in the capacitance between the predetermined points is in accordance with a change in warpage in the wafer.

11. The apparatus of claim 10 wherein:
the electrostatic chuck comprises at least one electrode coupled to the control arrangement for producing the clamping force on the wafer mounted on the clamping surface; and
the capacitive wafer warpage measuring tool comprises:
a plurality of insulated spaced-apart metallic layers mounted on the at least one electrode, each layer providing a separate capacitance with the adjacent surface of the wafer; and
a capacitance measuring device for measuring the capacitance at each of the plurality of metallic layers and providing a separate corresponding control signal to the controller for determining the minimum clamping voltage to be provided to the electrostatic chuck during a subsequent processing of the wafer.

12. The apparatus of claim 9 wherein the warpage measuring arrangement comprises an optical wafer warpage measuring arrangement for measuring the inherent warpage in the wafer.

13. The apparatus of claim 12 wherein the optical warpage measuring arrangement comprises:
a laser for scanning a narrow laser beam across an exposed surface of the wafer; and
a photodetector array disposed to intercept the laser beam reflected from the exposed surface of the wafer and provide a control signal to the controller indicating an amount of warpage of the wafer.

14. The apparatus of claim 8 wherein the control arrangement comprises:
a warpage measuring arrangement for measuring an amount of inherent warpage across the wafer, and generating an output control signal representing the measured wafer warpage; and
a software control comprising:
a memory for storing data related to a minimum clamping voltage for each wafer and a separate identification for each wafer to be subsequently processed on the electrostatic chuck; and
a controller responsive to the output control signal from the warpage measuring arrangement for determining and storing in the memory the minimum clamping voltage to be used for each identified wafer based on the measured wafer warpage, and for reading from the memory the minimum clamping voltage to be applied to the electrostatic chuck for a wafer being processed.

15. Apparatus for processing semiconductor wafers and similar devices comprising:
a single bipolar electrostatic chuck comprising a clamping surface and a clamping voltage generating device for generating a selective clamping voltage to provide a corresponding clamping force on a wafer mounted on the clamping surface;
a warpage measuring arrangement for measuring inherent warpage in the wafer to be processed on the electrostatic chuck, and for generating an output signal representative of the amount of measured warpage; and
a control arrangement responsive to the output signal from the warpage measuring arrangement for determining a minimum clamping voltage that securely clamps the wafer to the clamping surface when mounted on the electrostatic chuck and limits warpage and backside abrasion of the wafer based on the amount of wafer warpage measured by the warpage measuring arrangement, and for generating an output control signal to the clamping voltage generating device to cause the minimum clamping voltage to be applied to the electrostatic chuck during subsequent processing of the wafer.

16. The apparatus of claim 15 wherein the warpage measuring arrangement comprises a capacitive wafer warpage measuring tool for measuring a capacitance at predetermined points across a surface of the wafer, where a change in the capacitance between the predetermined points is in accordance with a change in warpage in the wafer.

17. The apparatus of claim 16 wherein:
the electrostatic chuck comprises at least one electrode coupled to the control arrangement for producing the clamping force on the wafer mounted on the clamping surface; and
the capacitive wafer warpage measuring tool comprises:
a plurality of insulated spaced-apart metallic layers mounted on the at least one electrode, each layer providing a separate capacitance with the adjacent surface of the wafer; and
a capacitance measuring device for measuring the capacitance at each of the plurality of metallic layers and providing a separate corresponding control signal to the controller for determining the minimum clamping voltage to be provided to the electrostatic chuck during a subsequent processing of the wafer.

18. The apparatus of claim 15 wherein the warpage measuring arrangement comprises an optical wafer warpage measuring arrangement for measuring the inherent warpage in the wafer.

19. The apparatus of claim 18 wherein the optical warpage measuring arrangement comprises:
a laser for scanning a narrow laser beam across an exposed surface of the wafer; and
a photodetector array disposed to intercept the laser beam reflected from the exposed surface of the wafer and provide a control signal to the controller indicating an amount of warpage of the wafer.

20. The apparatus of claim 15 wherein the control arrangement comprises a software control comprising:
a memory for storing data related to a minimum clamping voltage for each wafer and a separate identification for each wafer to be subsequently processed on the electrostatic chuck; and a controller responsive to the output control signal from the warpage measuring arrangement for determining and storing in the memory the minimum clamping voltage to be used for each identified wafer based on the measured wafer warpage, and for reading from the memory the minimum clamping voltage to be applied to the electrostatic chuck by the clamping voltage generating device for a wafer being processed.

21. A method of processing semiconductor wafers and similar devices comprising the steps of:

mounting a wafer on a predetermined surface;

measuring the inherent warpage of the wafer prior to the wafer being processed;

determining a minimum clamping voltage to be used for the wafer from the measured wafer warpage; and mounting the wafer on a clamping surface of a single bipolar electrostatic chuck and applying the minimum clamping voltage to the electrostatic chuck, where the minimum clamping voltage securely clamps the wafer to the clamping surface and limits warpage and backside abrasion of the wafer.

22. The method of claim 21 wherein measuring the warpage of the wafer comprises measuring the inherent warpage of the wafer using an optical wafer warpage measurement tool.

23. The method of claim 21 wherein measuring the warpage of the wafer comprises measuring the inherent warpage of the wafer using a capacitance wafer warpage measurement tool.

24. The method of claim 21 wherein determining the minimum clamping voltage comprises:

determining the minimum clamping voltage to be used for the wafer; and storing in a memory the minimum clamping voltage determined along with a unique identification of the wafer used and wherein mounting of the wafer comprises:

mounting the wafer used to determine the minimum clamping voltage on the clamping surface of the electrostatic chuck; and reading from the memory the minimum clamping voltage stored for the wafer and applying the minimum clamping voltage to the electrostatic chuck.

* * * * *